(12) United States Patent
Yi

(10) Patent No.: US 11,092,843 B2
(45) Date of Patent: Aug. 17, 2021

(54) POLARIZER PEELING APPARATUS AND PEELING METHOD THEREOF

(71) Applicant: Wuhan China Star Optoelectronics Semiconductor Display Technology Co., Ltd., Hubei (CN)

(72) Inventor: Guoxia Yi, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 766 days.

(21) Appl. No.: 15/775,244

(22) PCT Filed: Feb. 12, 2018

(86) PCT No.: PCT/CN2018/076568
§ 371 (c)(1),
(2) Date: May 10, 2018

(87) PCT Pub. No.: WO2019/148550
PCT Pub. Date: Aug. 8, 2019

(65) Prior Publication Data
US 2021/0088839 A1  Mar. 25, 2021

(30) Foreign Application Priority Data
Jan. 31, 2018  (CN) .......................... 201810093527.1

(51) Int. Cl.
*G02F 1/1335* (2006.01)
*B32B 7/02* (2019.01)
(Continued)

(52) U.S. Cl.
CPC .......... *G02F 1/133528* (2013.01); *B32B 7/02* (2013.01); *B32B 38/10* (2013.01);
(Continued)

(58) Field of Classification Search
CPC . B32B 38/10; B32B 2307/42; B32B 2457/20; B32B 2457/202;
(Continued)

(56) References Cited

U.S. PATENT DOCUMENTS

| 2006/0279679 | A1* | 12/2006 | Fujisawa | G02B 5/0278 349/116 |
| 2010/0055390 | A1* | 3/2010 | Ishizuka | B32B 27/322 428/119 |
| 2010/0264112 | A1* | 10/2010 | Jiang | B32B 37/0076 216/34 |

(Continued)

FOREIGN PATENT DOCUMENTS

| CN | 105116568 A | * | 12/2015 |
| CN | 106654062 A | * | 5/2017 |

OTHER PUBLICATIONS

English translation of CN 103407279.*

(Continued)

*Primary Examiner* — Sonya M Sengupta
(74) *Attorney, Agent, or Firm* — Leong C. Lei

(57) ABSTRACT

A apparatus for peeling a polarizer and a peeling method thereof are provided. The peeling method includes the following steps: dividing a polarizer into a plurality of etching areas; conducting etching with an ion beam on the plurality of etching areas, in sequence, by following a predetermined path; and removing, from the display panel, the polarizer that is not etched off by the ion beam. In the polarizer peeling method, an ion beam is used to conduct, in sequence, etching on a plurality of etching areas by following a predetermined path so as to avoid direct application of an external force to tear off a polarizer that might cause the events of the polarizer being broken or other film layers being damaged, and thus the efficiency of peeling can be improved.

16 Claims, 3 Drawing Sheets

(51) Int. Cl.
*B32B 38/10* (2006.01)
*C03C 15/00* (2006.01)
*B81C 1/00* (2006.01)

(52) U.S. Cl.
CPC .......... *B81C 1/00595* (2013.01); *C03C 15/00* (2013.01); *B32B 2307/42* (2013.01); *B32B 2457/20* (2013.01); *B32B 2457/202* (2013.01); *B32B 2457/206* (2013.01)

(58) Field of Classification Search
CPC ......... B32B 2457/206; G02F 1/133528; C03C 15/00; B81C 1/00595
See application file for complete search history.

(56) References Cited

U.S. PATENT DOCUMENTS

| | | | | |
|---|---|---|---|---|
| 2013/0192754 | A1* | 8/2013 | Dukkipati | H01L 21/02 |
| | | | | 156/308.2 |
| 2015/0068683 | A1* | 3/2015 | Ohno | B32B 17/10431 |
| | | | | 156/536 |
| 2015/0309341 | A1* | 10/2015 | Zhang | G02F 1/1303 |
| | | | | 445/2 |
| 2016/0318295 | A1* | 11/2016 | Liu | G02F 1/1309 |

OTHER PUBLICATIONS

English translation of CN 103770441.*
English translation of CN 103950269.*
English translation of CN 106654062.*
ISR of PCT/CN2018/076568 (Year: 2018).*

\* cited by examiner

POLARIZER PEELING APPARATUS AND PEELING METHOD THEREOF

RELATED APPLICATIONS

The present application is a National Phase of International Application Number PCT/CN2018/076568, filed Feb. 12, 2018, and claims the priority of China Application No. 201810093527.1, filed Jan. 31, 2018.

BACKGROUND OF THE INVENTION

1. Field of the Invention

The present invention relates to the field of technology for processing flexible panel, and more particularly to a polarizer peeling apparatus and a peeling method thereof.

2. The Related Arts

Flexible displays are display devices that are made of flexible materials and can be curved and possess various advantages, including reduced thickness, small size, being light weight, being easy to carry, saving energy and being environment friendly, and fashion. Thus, the flexible displays will be of fast progress in the field of display technology. The fabrication operations of the flexible displays are complicated and the structures thereof are made by stacking up multiple film layers. In addition, polarizers must be attached to surfaces of touch screens. During the operation of attachment, adverse factors, such as impurities, bubbles, and contaminants, may remain on the polarizers. In view of such adverse factors, oftentimes, re-work is necessary. A known re-work operation that is currently used is to peel, through application of an external force, the polarizers from the surfaces of the touch screens. This, however, may readily cause poor peeling result and damages to other film layers.

SUMMARY OF THE INVENTION

To overcome the deficiencies of the prior art, the present invention provides a polarizer peeling apparatus and a peeling method thereof, which help avoid poor peeling of polarizers and damages to other film layers.

A technical solution proposed in the present invention is to provide a peeling method for polarizers. The peeling method comprises the following steps:

dividing a polarizer into a plurality of etching areas;

conducting etching with an ion beam on the plurality of etching areas, in sequence, by following a predetermined path; and removing, from the display panel, the polarizer that is not etched off by the ion beam.

Optionally, the etching areas have shapes of square and a length of sides of the etching areas is equal to a diameter of a light spot of the ion beam.

Optionally, the light spot of the ion beam has a size of 0.1-1 micrometer.

Optionally, an incident direction of the ion beam is perpendicular to a surface of the polarizer.

Optionally, the step of conducting etching with an ion beam on the plurality of etching areas, in sequence, by following a predetermined path comprises:

conducting etching with the ion beam on a first etching area in the predetermined path;

recording etching parameters when etching is conducted to such a condition that the display panel is exposed; and applying the etching parameters to conduct etching with the ion beam on remaining etching areas of the plurality of etching areas, in sequence.

Optionally, the etching parameters comprises a size and intensity of a light spot of the ion beam and etching time.

Optionally, the predetermined path comprises an S-shaped curve extending in a first direction or a second direction, the first direction being perpendicular to the second direction.

Optionally, the predetermined path comprises a spiral shape.

Optionally, the step of removing, from the display panel, the polarizer that is not etched off by the ion beam applies an organic solution to remove, from the display panel, the polarizer that is not etched off by the ion etching.

The present invention also provides a polarizer peeling apparatus, which comprises an ion gun, a carrier table, and a flexible panel disposed on the carrier table. The flexible panel comprises a display panel and a polarizer arranged on the display panel. The ion gun has an emission opening that is arranged to face the polarizer. The ion gun and/or the carrier table are movable for conducting ion beam etching on the polarizer.

The preset invention provides a peeling method for polarizers, which uses an ion beam to conduct, in sequence, etching on a plurality of etching areas by following a predetermined path so as to avoid direct application of an external force to tear off a polarizer that might cause the events of the polarizer being broken or other film layers being damaged, and thus the efficiency of peeling can be improved.

DETAILED DESCRIPTION OF THE PREFERRED EMBODIMENTS

Figure 1:
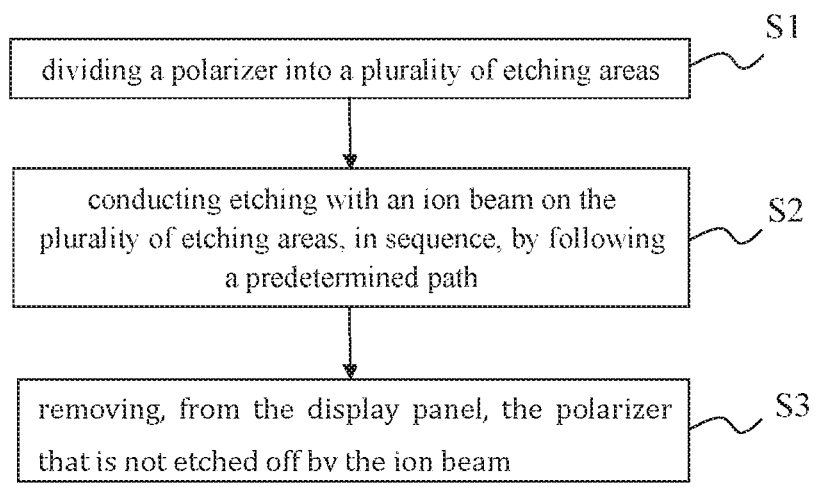
FIG. 1 is a flow chart showing a peeling method.

Embodiments of the present invention will be described in detail below, with reference to the attached drawings. However, the present invention can be embodied in various forms and this invention should not be construed as being limited to the specific embodiments described herein. Oppositely, these embodiments are provided just for the purpose of explaining the principle of this invention and practical applications thereof, in order to allow skilled persons of this field to appreciate various embodiments of this invention and various modifications thereof that suit to specific predetermined applications. In the drawings, similar reference numerals are consistently used to designate the same elements.

Figure 2:
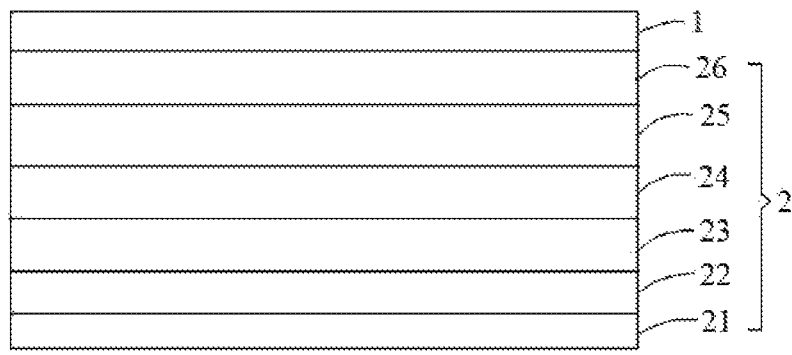
FIG. 2 is a schematic view illustrating a structure of a flexible panel.
Figure 3:
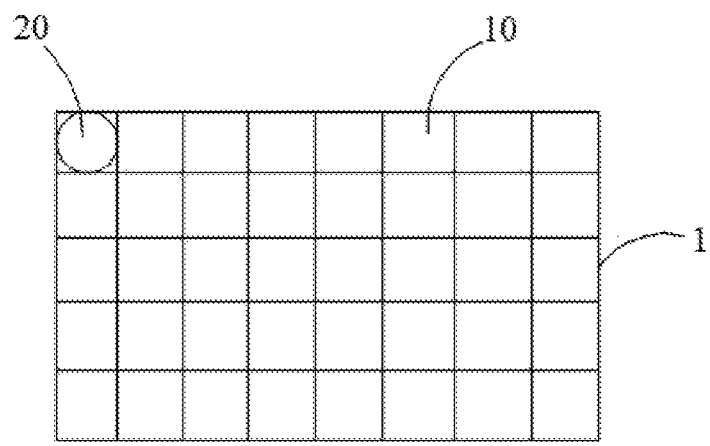
FIG. 3 is a schematic view illustrating a structure of a polarizer.

Referring to FIGS. 1, 2, and 3, the instant embodiment provides a peeling method for polarizers, which is adopted to remove a polarizer 1 attached to a display panel 2. The display panel 2 can be a liquid crystal display (LCD) panel or an organic light emitting display (OLED), and here, a description of the peeling method will be provided by taking an OLED panel as an example of the display panel 2, wherein the display panel 2 comprises, arranged in a manner of being sequentially stacked, a base plate 21, an alignment film 22, an array substrate 23, an OLED display layer 24, a package layer 25, a touch layer 26, and a polarizer 1 attached to a surface of the touch layer 26. The peeling method comprises the following steps:

S1, dividing the polarizer into a plurality of etching areas;

S2, conducting etching with an ion beam on the plurality of etching areas, in sequence, by following a predetermined path; and S3, removing, from the display panel 2, a part of the polarizer that is not etched off by the ion beam.

Specifically, in Step S1, the polarizer 1 is divided into a plurality of etching areas 10 according to a size of a light spot 20 of the ion beam. Since the light spot 20 of the ion beam has a shape of circle and the etching areas 10 have shapes of square, a length of sides of the etching areas 10 is made equal to a diameter of the light spot 20 of the ion beam and a center of the light spot 20 of the ion beam is set coincident with a center of each of the etching areas 10 so that when the light spot 20 of the ion beam is projected onto the etching area 10, a surface area of the etching area 10 that can be covered by the light spot 20 of the ion beam is maximum, meaning an etching area is made maximum.

The light spot 20 of the ion beam cannot be excessively large. If the light spot 20 of the ion beam is excessively large, then the part of the polarizer 1 that remains is of a relatively large amount and loading of a subsequent cleaning operation could be heavy. The light spot 20 of the ion beam cannot be excessively smaller either. If the light spot 20 of the ion beam is excessively small, then the loading of etching operations would be increased thereby reducing the efficiency of etching. Thus, the size of the light spot 20 of the ion beam must be determined according to an actual surface of the polarizer 1. Preferably, in the instant embodiment, the size of the light spot 20 of the ion beam is taken as 0.1-1 micrometers. This makes it possible to maintain the etching efficiency but also reduce the loading of subsequent cleaning.

An incident direction of the ion beam is made perpendicular to the surface of the polarizer 1 so that, on the one hand, the light spot 20 of the ion beam could cover the etching area 10 as large as possible, and on the other hand, energy of the ion beam could be uniformly distributed on the etching area 10, to thereby maintain the etching speed consistent for the etching areas and improve uniformity of etching.

To ensure a desired result of etching, which is that the ion beam just etches off the polarizer 1 but does not cause damage to other film layer, Step S2 specifically comprises:

S21, conducting etching with the ion beam on a first etching area 10 in the predetermined path;

S22, recording etching parameters when etching is conducted to such a condition that the display panel is exposed; and S23, applying the etching parameters to conduct etching with the ion beam on remaining etching areas 10 of the plurality of etching areas 10, in sequence.

In Step S21, preset etching parameters are first adopted to carry out the ion beam etching on the first etching area 10. In Step S22, inspection of the etching result of the first etching area 10 is made with a microscope so that when it is observed that the etching carried out with the ion beam reach a condition that the display panel 2 is just exposed, the etching is stopped and the etching parameters of this moment are recorded. These etching parameters are the etching parameters that could ensure the desired result of etching. In Step S23, the etching parameters so obtained are used to carry out etching on the remaining etching areas 10. Preferably, in the instant embodiment, the etching parameters comprise the size and intensity of the light spot of the beam and etching time.

Figure 4:
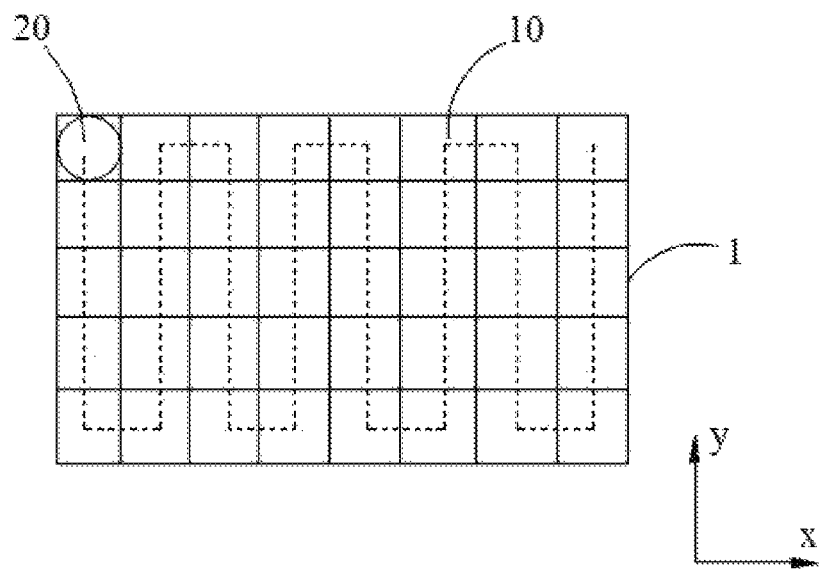
FIG. 4 is a schematic view illustrating a predetermined path according to a first example.

Referring to FIG. 4, in a first example of the instant embodiment, the predetermined path comprises an S-shaped curve extending in a first direction or a second direction. The first direction is perpendicular to the second direction. The first direction can be the x-direction shown in FIG. 4; and the second direction is the y-direction of FIG. 4. An S-shaped curve extending in the x-direction is arranged in a direction from a first column of the etching areas to a last column of the etching areas (see phantom lines of FIG. 4), or may alternatively be in a direction from the last column of the etching areas to the first column of the etching areas. An S-shaped curve extending in the y-direction is arranged in a direction from a first row of the etching areas to a last row of the etching areas, or may alternatively be in a direction from the last row of the etching areas to the first row of the etching areas.

Figure 5:
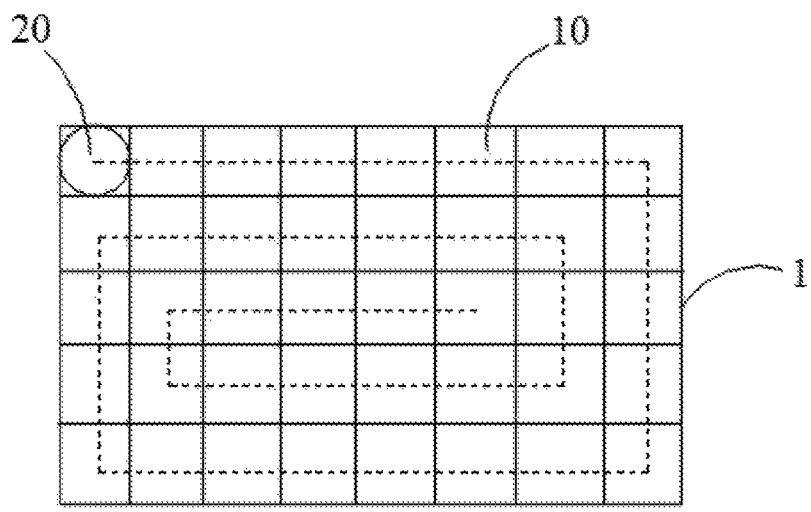
FIG. 5 is a schematic view illustrating a predetermined path according to a second example.

Referring to FIG. 5, in a second example of the instant embodiment, the predetermined path is a spiral curve and the spiral can be of a clockwise direction or a counterclockwise direction.

In Step S3, a part of each of the etching areas 10 that is etched off by the ion beam has a surface area that correspond to a surface area of the light spot of the ion beam. A part of the etching area 10 that is left is removed with an organic solution or is first removed with a blade, followed by application of an organic solution for further removal.

The instant embodiment uses an ion beam to peel off a polarizer 1 and avoid directly tearing the polarizer to cause events of the polarizer being broken or other film layers being damaged so as to improve peeling performance.

Figure 6:
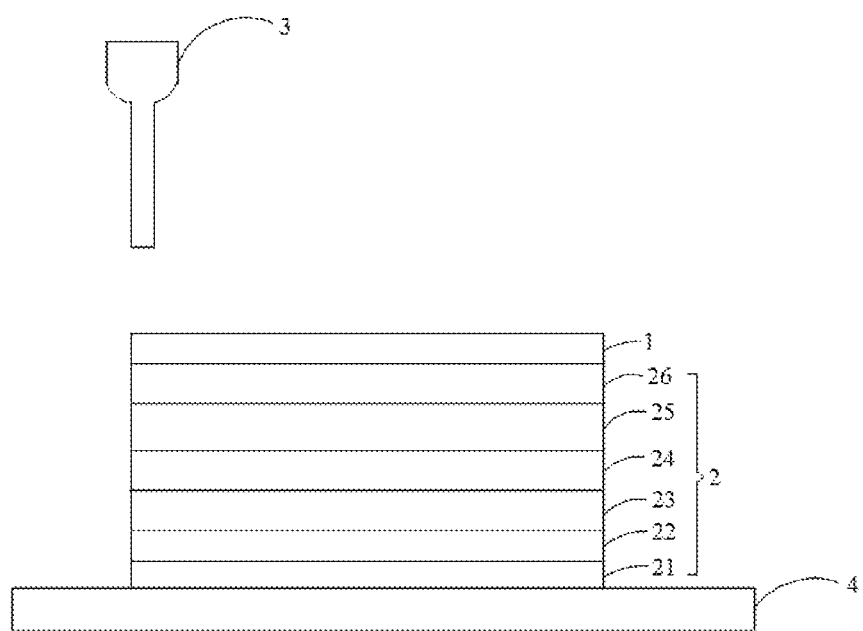
FIG. 6 is a schematic view illustrating a structure of a peeling apparatus.

Referring to FIG. 6, the present invention also provides a peeling apparatus for polarizers. The peeling apparatus comprises an ion gun 3, a carrier table 4, and a flexible panel disposed on the carrier table 4. The flexible panel comprises a display panel 2 and a polarizer 1 arranged on the display panel 2. The display panel 2 can be an OLED. The ion gun 3 has an emission opening that is arranged to face the polarizer 1. The ion gun 3 emits an ion beam, and the ion beam emitting from the ion gun 3 is perpendicular to a surface of the polarizer 1.

Etching with the ion beam is carried out on the polarizer 1 when the ion gun 3 and/or the carrier table 4 are moved. It only needs to move just the ion gun 3 along the predetermined path to carry out, in sequence, ion beam etching on the plurality of etching areas 10, or alternatively; the ion gun 3 and the carrier table 4 are both moved, simultaneously; to carry out, in sequence, ion beam etching on the plurality of etching areas 10 by following the predetermined path.

The above provides embodiments of the present invention. It is noted that for those having ordinary skills in the field, various improvements and modifications can be made without departing from the principle of the application and such improvements and modifications are considered falling in the protection scope of the application.

What is claimed is:

1. A polarizer peeling method, comprising the following steps:
   dividing a polarizer into a plurality of etching areas;
   conducting etching with an ion beam on the plurality of etching areas, in sequence, by following a predetermined path; and
   removing, from a display panel, the polarizer that is not etched off by the ion beam;
   wherein the etching areas have shapes of square and a length of sides of the etching areas is equal to a diameter of a light spot of the ion beam.

2. The peeling method according to claim 1, wherein the light spot of the ion beam has a size of 0.1-1 micrometer.

3. The peeling method according to claim 1, wherein an incident direction of the ion beam is perpendicular to a surface of the polarizer.

4. The peeling method according to claim 1, wherein the step of conducting etching with an ion beam on the plurality of etching areas, in sequence, by following a predetermined path comprises:
   conducting etching with the ion beam on a first etching area in the predetermined path;
   recording etching parameters when etching is conducted to such a condition that the display panel is exposed; and
   applying the etching parameters to conduct etching with the ion beam on remaining etching areas of the plurality of etching areas, in sequence.

5. The peeling method according to claim 4, wherein the etching parameters comprises a size and intensity of a light spot of the ion beam and etching time.

6. The peeling method according to claim 1, wherein the predetermined path comprises an S-shaped curve extending in a first direction or a second direction, the first direction being perpendicular to the second direction.

7. The peeling method according to claim 2, wherein the predetermined path comprises an S-shaped curve extending in a first direction or a second direction, the first direction being perpendicular to the second direction.

8. The peeling method according to claim 3, wherein the predetermined path comprises an S-shaped curve extending in a first direction or a second direction, the first direction being perpendicular to the second direction.

9. The peeling method according to claim 4, wherein the predetermined path comprises an S-shaped curve extending in a first direction or a second direction, the first direction being perpendicular to the second direction.

10. The peeling method according to claim 5, wherein the predetermined path comprises an S-shaped curve extending in a first direction or a second direction, the first direction being perpendicular to the second direction.

11. The peeling method according to claim 1, wherein the predetermined path comprises a spiral shape.

12. The peeling method according to claim 2, wherein the predetermined path comprises a spiral shape.

13. The peeling method according to claim 3, wherein the predetermined path comprises a spiral shape.

14. The peeling method according to claim 4, wherein the predetermined path comprises a spiral shape.

15. The peeling method according to claim 5, wherein the predetermined path comprises a spiral shape.

16. The peeling method according to claim 1, wherein the step of removing, from the display panel, the polarizer that is not etched off by the ion beam applies an organic solution to remove, from the display panel, the polarizer that is not etched off by the ion etching.

* * * * *